(12) United States Patent
Park

(10) Patent No.: US 6,867,095 B2
(45) Date of Patent: Mar. 15, 2005

(54) METHOD FOR THE FABRICATION OF A SEMICONDUCTOR DEVICE UTILIZING SIMULTANEOUS FORMATION OF CONTACT PLUGS

(75) Inventor: Cheol Soo Park, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 104 days.

(21) Appl. No.: 10/324,304

(22) Filed: Dec. 20, 2002

(65) Prior Publication Data

US 2003/0119252 A1 Jun. 26, 2003

(30) Foreign Application Priority Data

Dec. 24, 2001 (KR) .................................. 10-2001-0084009

(51) Int. Cl.⁷ .......................................... H01L 21/8242
(52) U.S. Cl. ...................................... 438/253; 438/396
(58) Field of Search ................................ 438/253, 256, 438/396

(56) References Cited

U.S. PATENT DOCUMENTS 5,648,291 A * 7/1997 Sung .......................... 438/396
5,675,176 A    10/1997 Ushiku et al.
6,235,575 B1 *  5/2001 Kasai et al. ................. 438/242
6,242,772 B1    6/2001 Wahlstrom
6,391,736 B1 *  5/2002 Uh et al. ..................... 438/396
6,642,097 B2 * 11/2003 Tu ............................. 438/241

* cited by examiner

Primary Examiner—W. David Coleman
(74) Attorney, Agent, or Firm—Timothy J. Keefer; Seyfarth Shaw LLP

(57) ABSTRACT

A method for fabricating a semiconductor device comprising: providing a semiconductor substrate on which a transistor made of a gate electrode, a source/drain is formed; forming a first insulating layer on the semiconductor substrate, with bit-line contact holes and a storage node contact hole being formed in the insulating layer to expose the source and drain; forming bit-line contact plugs and storage node in the bit-line contact holes and the storage node contact hole; removing the first insulating layer; forming a second insulating layer on the resultant structure; forming a first conductive layer on the second insulating layer; forming a third insulating layer; forming bit-line contact holes by selective removal of the first conductive layer and the third insulating layer opposing the upper surface of the bit-line contact plug; and forming a second conductive layer in the bit-line contact holes.

5 Claims, 3 Drawing Sheets

METHOD FOR THE FABRICATION OF A SEMICONDUCTOR DEVICE UTILIZING SIMULTANEOUS FORMATION OF CONTACT PLUGS

BACKGROUND OF THE INVENTION

1. Field of the invention

The present invention relates to a method for fabricating a semiconductor device, and more particularly to a method for fabricating a semiconductor device, which can simplify the fabrication process of a capacitor and reduce the production costs.

2. Description of the Prior Art

As generally known in the art, in a conventional process of fabricating a capacitor in a semiconductor device, at the time of contact hole formation so as to form a second contact plug for a bit-line, difficulty of forming contact holes production arises because etch selection rate for each layer have varied, thus resulting the increase of costs.

Further, at the time of forming a lower electrode, it has been troublesome to use two separate masks, one for a storage node contact and the other for a storage node.

Accordingly, as regards the conventional process of fabricating a capacitor in a semiconductor device, unnecessary separate masking processes are required, such as one masking process for the storage node contact and a separate masking process for the storage node, so that fabrication process has been complicated and production costs have increased.

SUMMARY OF THE INVENTION

Accordingly, the present invention has been made to solve the above-mentioned problems occurring in the prior art, and an object of the present invention is to provide a method for fabricating a semiconductor device, which can simplify the fabrication process of a capacitor in a semiconductor device and reduce the production costs thereof.

In order to accomplish this object, there is provided a method for fabricating a semiconductor device, comprising the steps of: providing a semiconductor substrate in which a transistor consisting of a gate electrode and source/drain regions was formed, the gate electrode having a spacer formed on its sidewall; forming a first bit-line contact plug and a storage node contact plug on the source/drain regions, respectively; forming a first insulating film on the resulting structure; polishing the first insulating film by CMP until the first bit-line contact plug and the storage node contact plug are exposed; forming a second bit-line contact plug and a storage node on the first bit-line contact plug and the storage node contact plug, respectively; sequentially forming a capacitor insulating film and a plate node on the resulting structure including the second bit-line contact plug and the storage node; forming a second insulating film on the entire surface of the substrate including the plate node; selectively etching a portion of the second insulating film, a portion of the plate node and a portion of the capacitor insulating film, to form a bit-line contact hole exposing the second bit-line contact plug; and forming a bit-line in the bit-line contact hole and on the second insulating film.

In the present invention, the first and second bit-line contact plugs, the storage node contact plug and the storage node are formed of one selected from the group consisting of an anisotropic epitaxial silicon layer, an anisotropic polysilicon layer, an isotropic epitaxial silicon layer, and an isotropic polysilicon layer.

Also, the step of forming the second bit-line contact hole and the storage node comprises the sub-steps of: forming a dummy insulating film on the resulting substrate on which the first bit-line contact plug and the storage node contact plug were formed; etching the dummy insulating film to form a contact hole for the second bit-line contact plug and a contact hole for the storage node, which expose the first bit-line contact plug and the storage node contact plug, respectively; forming a polysilicon film on the dummy insulating film such that the polysilicon film is filled in the contact hole for the second bit-line contact plug and the contact hole for the storage node; polishing the polysilicon film by CMP such that the dummy insulating film is exposed; and removing the dummy insulating film.

Additionally, the etching step for forming the bit-line contact hole is performed with an etch recipe so formulated that the etch selectivity between the second insulating film, the plate node and the capacitor insulating film is 1:1:1.

Further, the method for fabricating a semiconductor device of the present invention further comprises after the step of forming the second bit-line contact hole but before the step of forming the bit-line, the step of forming a spacer-insulating film on the sidewall of the bit-line contact hole.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
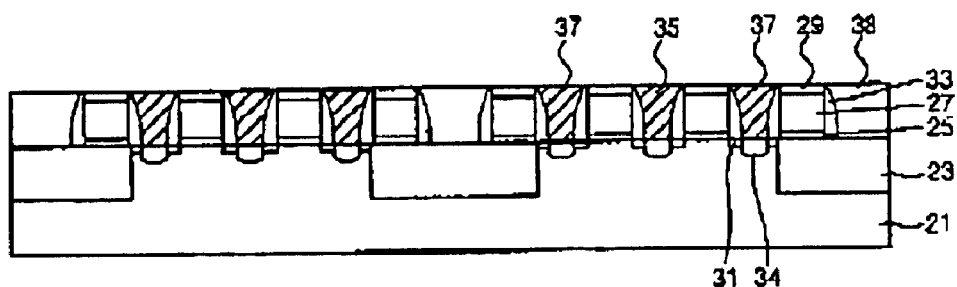
FIGS. 1 to 4 are cross-sectional views for illustrating each step of a method for fabricating a semiconductor device in accordance with the present invention.

Hereinafter, a preferred embodiment of the present invention will be described with reference to the accompanying drawings. In the following description and drawings, the same reference numerals are used to designate the same or similar components, and so repetition of the description of the same or similar components will be omitted.

FIGS. 1 to 4 are cross-sectional views for illustrating each step of a method for fabricating a semiconductor device in accordance with the present invention.

Referring to FIG. 1, a field oxide film 23 defining an active region is first formed in a semiconductor substrate 21. Then, on the active region of the semiconductor substrate 21, a gate electrode 27 having a gate insulating film on its lower surface and a mask insulating film 29 at its upper surface is formed according to a known process.

Then, low concentration impurities are implanted into the semiconductor substrate 21 below both sides of the gate electrode 27 to form an N-LDD region 31, after which a nitride spacer 33 is formed on the sidewall of the gate electrode 27. Then, high concentration impurities is implanted into the semiconductor substrate to form source/drain region 34 in a portions of the semiconductor substrate 21, which are located between the gate electrodes 27 including the nitride spacer 33.

Next, on the source/drain region 34 exposed to the outside, a first bit-line contact plug 35 and a storage node contact plug 37, which are formed of an anisotropic epitaxial silicon layer, an anisotropic polysilicon layer, an isotropic epitaxial silicon layer or an isotropic polysilicon layer, is formed by a selective epitaxial growth process.

Thereafter, on the resulting structure, a first insulating film 38 is deposited to large thickness, and then, polished by CMP until the bit-line contact plug 35 and the storage node contact plug 37 are exposed.

Figure 2:
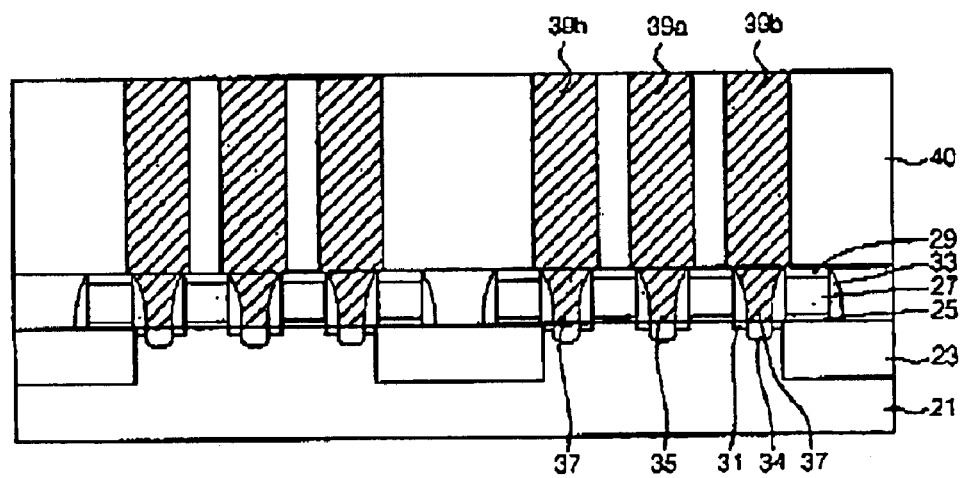

Referring to FIG. 2, a dummy insulating film 40 is then deposited on the resulting structure and etched to form contact holes (not shown) for a second bit-line contact plug and a storage node, the contact holes exposing the first bit-line contact plug 35 and the storage node contact plug 37, respectively. Then, in the contact holes for the second bit-line contact plug and storage node, an anisotropic epitaxial silicon layer, an anisotropic polysilicon layer, an isotropic epitaxial silicon layer or an isotropic polysilicon layer is grown by a selective epitaxial growth process using the first bit-line contact plug 35 and the storage node contact plug 37 as seeds, thereby forming a second bit-line contact plug 39a and a pillar-type storage node 39b.

Figure 3:
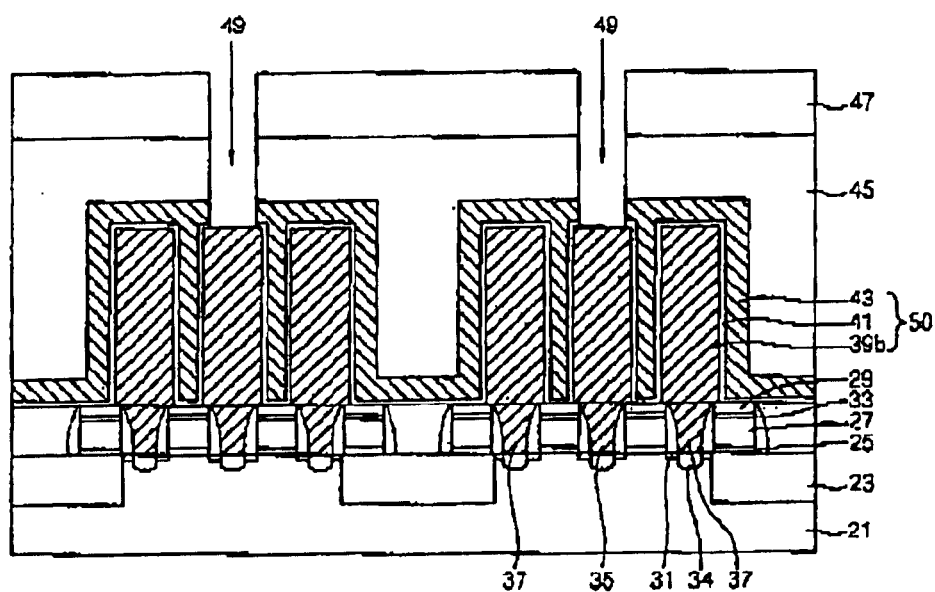

Referring to FIG. 3, the remaining dummy insulating film is then removed. Next, a capacitor insulating film 41 is formed on the resulting structure including the second bit-line contact plug 39a and the pillar-type storage node 39b, after which a plate node 43 is formed on the capacitor insulating film 41, thereby completing a capacitor 50.

Subsequently, a second insulating film 45 is deposited on the plate electrode 43 to large thickness, and then, its surface is planarized. Next, a photoresist film pattern 47 that exposes a portion the second insulating film 45, which is located on the second bit-line contact plug 39a, is formed on the second insulating film 45. Then, using the photoresist film pattern 47 as an etch mask, the exposed portion of the second insulating film 45, and a portion of the plate node 43 and a portion of the capacitor insulating film 41, which are located below the exposed portion of the second insulating film 45, are sequentially etched, thereby forming a bit-line contact hole. In the etching process to form the bit-line contact hole 49, an etch recipe so formulated that the etch selectivity of the second insulating film 45, the plate node 43 and the capacitor insulating film 44 is 1:1:1 is used such that the contact hole 49 is formed in one step.

Figure 4:
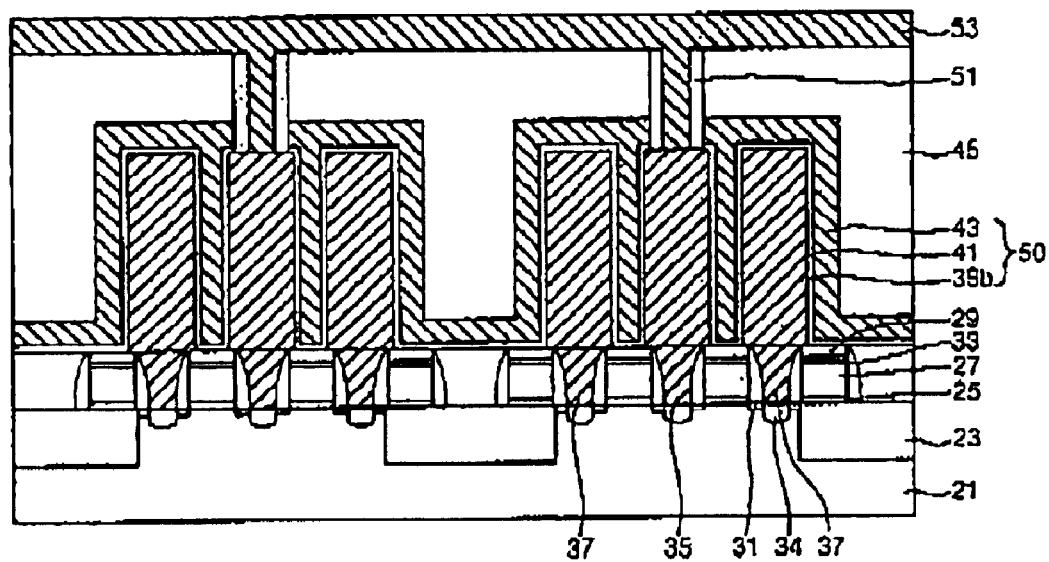

Referring now to FIG. 4, after the removal of the photoresist film pattern 45, a spacer-insulating film 51 is formed on the inner sidewall of the bit-line contact hole 49. Then, a bit-line conductive layer 53, which is electrically connected with the second bit-line contact plug 39a, is formed on the second insulating film 45 including the bit-line contact hole 49.

Then, although not shown in the drawings, a bit-line (not shown) is formed by selectively patterning the conductive layer 53.

In another embodiment of the present invention that is an alternative to the above method utilizing the selective epitaxial growth process, the second bit-line contact plug and the pillar-type storage node may also be formed by depositing a polysilicon film on the dummy insulating film including the contact holes for the second bit-line contact plug and the storage node, and then treating the deposited polysilicon film by CMP. Subsequent processes are performed in the same manner as described in the first embodiment of the present invention.

The following advantages are achieved according to the method for fabricating a semiconductor device of the present invention.

The present invention allows the second bit-line contact hole to be formed in one step, because, in forming the contact hole, the invention utilizes the etch recipe so formulated that the etch selectivity between the second insulating film, the plating electrode and the capacitor insulating film is 1:1:1. Thus, the invention allows a reduction in device fabrication cost, and particularly requires neither a mask for the storage node contact plug nor a mask for the storage node.

Accordingly, the present invention allows elimination of a process for forming the mask for the storage node contact plug and also a process for forming the mask for the storage node. This allows a device fabrication process to be simplified, resulting in a reduction in production costs.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device, comprising the steps of:

providing a semiconductor substrate in which a transistor consisting of a gate electrode, and source/drain regions was formed, the gate electrode having a spacer formed on its sidewall;

forming a first bit-line contact plug and a storage node contact plug on the source/drain regions, respectively, forming a first insulating layer on the resulting structure;

polishing the first insulating layer by CMP until the first bit-line contact plug and the storage node contact plug are exposed;

forming a second bit-line contact plug and a storage node on the first bit-line contact plug and the storage node contact plug, respectively;

sequentially forming a capacitor insulating layer and a plate node on the resulting structure including the second bit-line contact plug and the storage node;

forming a second insulating layer on the entire surface of the substrate including the plate node;

selectively etching a portion of the second insulating layer, a portion of the plate node and a portion of the capacitor insulating layer, to form a bit-line contact hole exposing the second bit-line contact plug; and forming a bit-line in the bit-line contact hole and on the second insulating layer.

2. The method for fabricating a semiconductor device according to claim 1, wherein the first and second bit-line contact plugs, the storage node contact plug and the storage node are formed of one selected from the group consisting of an anisotropic epitaxial silicon layer, an anisotropic polysilicon layer, an isotropic epitaxial silicon layer, and an isotropic polysilicon layer.

3. A method for fabricating a semiconductor device comprising the steps of:

providing a semiconductor substrate in which a transistor having of a gate electrode and source/drain regions was formed, the gate electrode having a spacer formed on its sidewall;

forming a first bit-line contact plug and a storage node contact plug on the source/drain regions, respectively;

forming a dummy insulating layer on the resulting substrate on which the first bit-line contact plug and the storage node contact plus were formed;

etching the dummy insulating layer to fonn a contact hole for the second bit-line contact plug and a contact hole for the storage node, which expose the first bit-line contact plug and the storage node contact plug, respectively;

forming a polysilicon layer on the dummy insulating layer such that the polysilicon layer is filled in the contact hole for the second bit-line contact plus and the contact hole for the storage node;

polishing the polysilicon layer by CMP such that the dummy insulating layer is exposed; and removing the dummy insulating layer;

forming a second bit-line contact line plug and a storage node on the first bit-line contact plug and the storage node contact plug respectively;

sequentially forming a capacitor insulating layer and a plate node on the resulting structure including the second bit-line contact plug and the storage node;

forming a second insulating layer on the entire surface of the substrate including the plate node;

selectively etching a portion of the second insulating layer, a portion of the plate node and a portion of the capacitor insulating layer, to form a bit-line contact hole exposing the second bit-line contact plup; and forming a bit-line in the bit-line contact hole and on the second insulating layer.

4. The method for fabricating a semiconductor device according to claim 1, wherein the etching step for forming the bit-line contact hole is performed with an etch recipe so formulated that the etch selectivity between the second insulating layer, the plate node and a the capacitor insulating layer is 1:1:1.

5. The method for fabricating a semiconductor device according to claim 1, which further comprises, after the step of forming the second bit-line contact hole and before the step of forming the bit-line, the step of forming a spacer-insulating layer on the sidewall of the bit-line contact hole.

* * * * *